United States Patent
Kimishima (10) Patent No.: US 7,577,416 B2
(45) Date of Patent: Aug. 18, 2009

(54) SINGLE BALANCED MIXER

(75) Inventor: Masayuki Kimishima, Gyoda (JP)

(73) Assignee: Advantest Corp., Tokyo (JP)

( * ) Notice: Subject to any disclaimer, the term of this patent is extended or adjusted under 35 U.S.C. 154(b) by 250 days.

(21) Appl. No.: 09/756,442

(22) Filed: Jan. 8, 2001

(65) Prior Publication Data

US 2001/0027091 A1 Oct. 4, 2001

(51) Int. Cl.
*H04B 1/26* (2006.01)
*H04B 15/00* (2006.01)

(52) U.S. Cl. .................. 455/313; 455/318; 455/326

(58) Field of Classification Search .......... 455/209, 455/313–327, 328, 330
See application file for complete search history.

(56) References Cited

U.S. PATENT DOCUMENTS

| | | | | |
|---|---|---|---|---|
| 4,369,522 A | * | 1/1983 | Cerny et al. | 455/333 |
| 4,607,394 A | * | 8/1986 | Nightingale | 455/327 |
| 4,823,400 A | * | 4/1989 | Dobrovolny | 455/326 |
| 5,020,148 A | * | 5/1991 | Bonato | 455/302 |
| 5,027,163 A | * | 6/1991 | Dobrovolny | 455/326 |
| 5,034,994 A | * | 7/1991 | Muterspaugh et al. | 455/326 |
| 5,517,687 A | * | 5/1996 | Niehenke et al. | 455/325 |
| 5,774,801 A | * | 6/1998 | Li et al. | 455/326 |
| 5,819,169 A | * | 10/1998 | Fudem | 455/326 |
| 5,832,376 A | * | 11/1998 | Henderson et al. | 455/327 |
| 5,862,466 A | * | 1/1999 | Erickson | 455/321 |
| 5,903,827 A | * | 5/1999 | Kennan et al. | 455/326 |

\* cited by examiner

*Primary Examiner*—Simon D Nguyen
(74) *Attorney, Agent, or Firm*—Muramatsu & Associates (57) ABSTRACT

A single balanced mixer has a high degree of isolation between an IF signal and an RF signal and a high conversion efficiency. The single balanced mixer includes means for producing two local signals of same amplitude and opposite phase, a pair of mixing elements each receiving a corresponding one of the two local signals, a pair of strip lines for transmitting the input RF signal to the mixing elements. One end of each of the strip lines is connected to one another at a point where the RF signal is supplied and other end of each of the strip lines is connected to the corresponding mixing element. A length of each of the strip lines is one fourth of a wave length of the IF signal.

5 Claims, 7 Drawing Sheets

SINGLE BALANCED MIXER

FIELD OF THE INVENTION

This invention relates to a single balanced mixer for mixing an input signal with a local signal for producing an intermediate frequency signal, and more particularly, to a wide band single balanced mixer with high signal isolation capability and low conversion loss to be used in test instruments or communication devices in microwave and millimeter wave bands.

BACKGROUND OF THE INVENTION

A frequency mixer is used for mixing an high frequency input signal RF with a local signal Lo and producing intermediate frequency (IF) signals of sum and/or difference between the input and local signal frequencies. A frequency mixer in a microwave band or a millimeter wave band utilizes a nonlinear characteristic of, for example, diodes and/or transistors. There are several types of frequency mixer, such as an unbalanced mixer, a single balanced mixer and a double balanced mixer. This invention is directed to a single balanced mixer.

Figure 5:
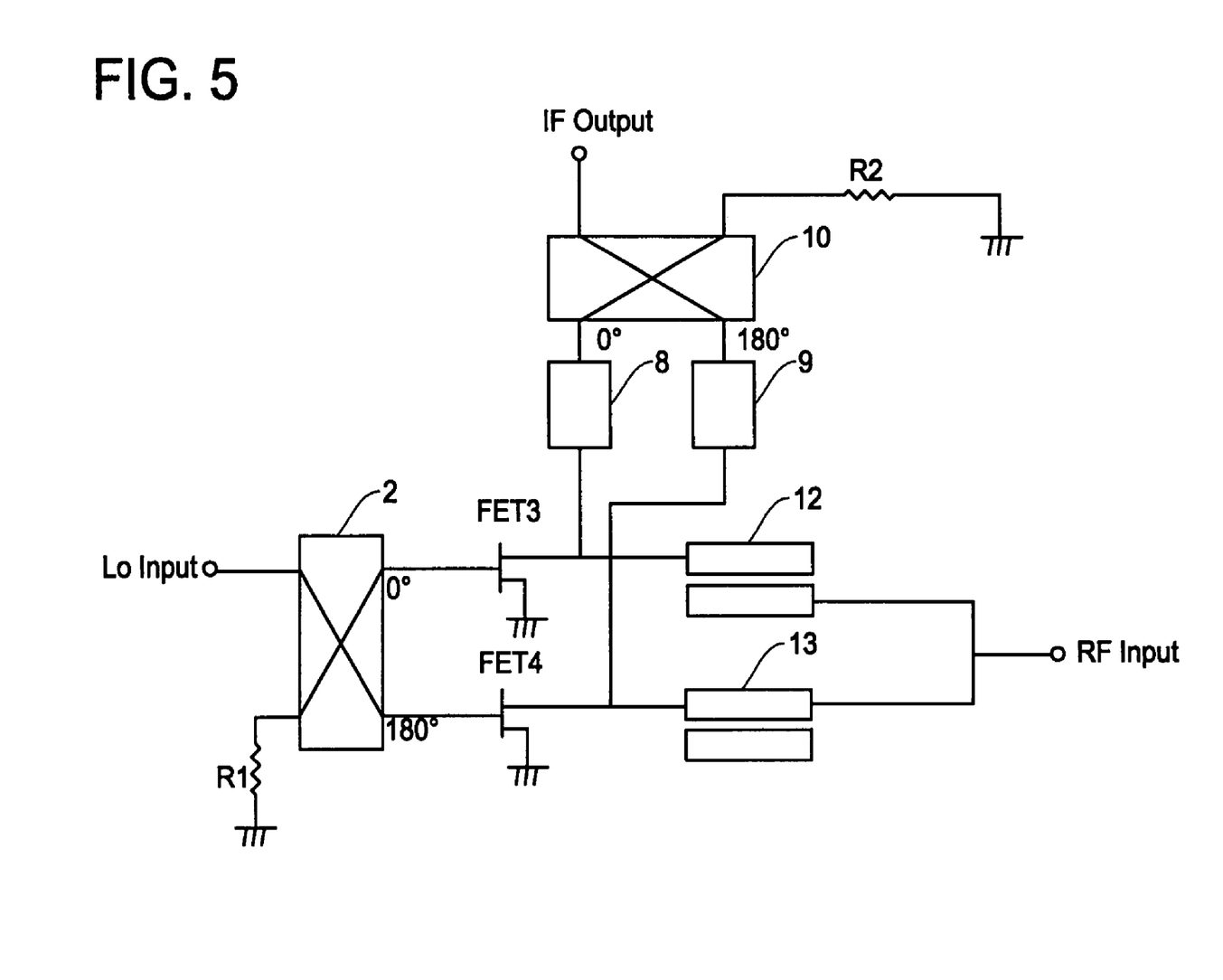
FIG. 5 is a block diagram showing a structure of a single balanced mixer in the prior invention made by the same inventor of the present invention.

In the past, the inventor of this invention has proposed a single balanced mixer for microwave and millimeter wave bands in a Japanese Patent Application No. 11-7252 filed Sep. 22, 1999 owned by the same assignee of this invention. An essential structure of this prior invention is shown in FIG. 5. It should be noted that this prior invention is not in the public domain and thus not the prior art against the present invention.

In the example of FIG. 5, a wide band single balanced mixer includes field effect transistors (FET) as mixing elements. A structure and operation of the single balanced mixer of FIG. 5 will be explained in the following. The single balanced mixer includes a 180° hybrid coupler 2, terminal resistors R1 and R2, field effect transistors FET3 and FET4 as mixing elements, RF frequency λ/4 microstrip line couplers 12 and 13, IF filters 8 and 9, and a 180° hybrid coupler 10.

In operation, a local signal Lo is supplied to an input terminal of the 180° hybrid coupler 2 whose other input terminal is connected to the terminal resistor R1. The 180° hybrid coupler 2 produces two local signals with the same amplitude and opposite phase (0° and 180°) to one another at its output terminals. The two local signals with opposite phase (0° and 180°) are respectively applied to the gates D of the transistors FET3 and FET4, thereby turning on or off the transistors FET3 and FET4.

An input RF signal is separated into two signals of the same amplitude and same phase at a T-junction near the RF input terminal in FIG. 5. One of the two separated RF signals is applied to the drain D of the transistor FET3 through the λ/4 microstrip line coupler 12, and the other separated RF signal is applied to the drain D of the transistor FET4 through the λ/4 microstrip line coupler 13.

Then, the local signals Lo of the opposite phase and same amplitude and the input RF signals of the same phase and same amplitude are mixed with one another by the frequency mixer formed of the transistors FET3 and FET4, thereby frequency converting the input RF signals into IF (intermediate frequency) signals of opposite phase (0° and 180°) and same amplitude which are produced at the drains D of the transistors FET3 and FET 4.

The IF signals of the opposite phase (0° and 180°) and same amplitude are respectively filtered to a desired IF frequency by the IF filters 8 and 9. Typically, the IF filters 8 and 9 are band-pass filters for allowing signals of only selected frequencies to pass therethrough. Moreover, the two IF signals filtered by the IF filters 8 and 9 are combined in the same phase into one IF signal by the 180° hybrid coupler 10. As shown in FIG. 5, the 180° hybrid coupler 10 produces the resultant IF signal at one output terminal while its other terminal is terminated by the terminal resistor R2.

The more detailed explanation is given here regarding the λ/4 microstrip line couplers 12 and 13 in the wide band single balanced mixer in the prior invention of FIG. 5. The purpose of the λ/4 microstrip line couplers 12 and 13 is to provide the input RF signals to the mixer transistors FET3 and FET4 while isolating the IF signal from the RF signal. For this purpose, each of the λ/4 microstrip line couplers 12 and 13 has a length which is one fourth of the wave length of the input RF signal.

At each drain of the transistors FET3 and FET4, there exist IF signals produced by the frequency conversion and the RF signals through the λ/4 microstrip line couplers 12 and 13, respectively. Therefore, in order to prevent the frequency converted IF signals at each drain D of the transistor FET3 and FET4 from leaking into the RF signal input, the λ/4 microstrip line couplers 12 and 13 are designed that it has a low impedance for the RF frequency and a high impedance for the IF frequency.

Figure 6:
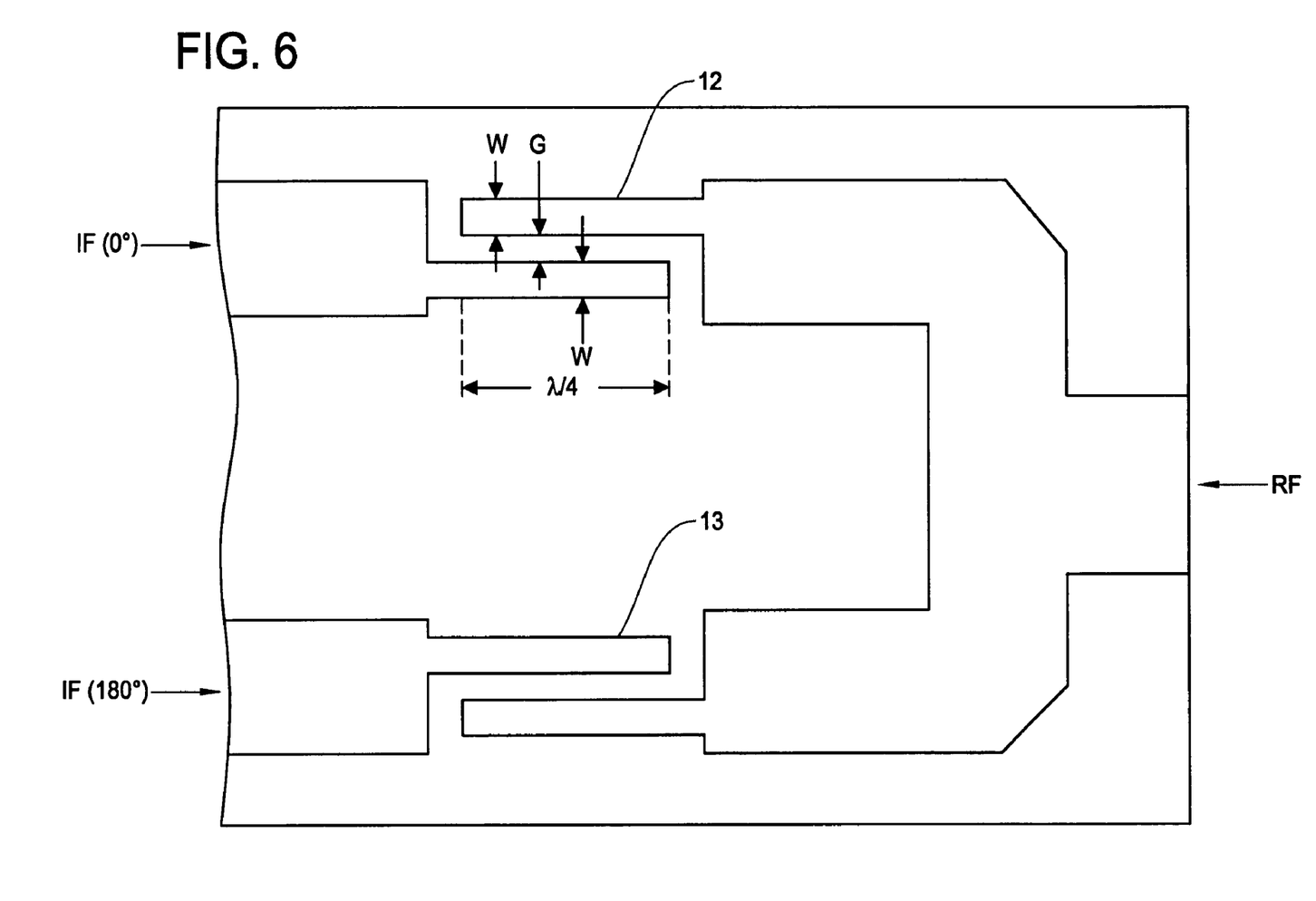
FIG. 6 is a top view showing an example of structure of λ/4 microstrip line couplers used in the single balanced mixer of FIG. 5.

FIG. 6 shows an example of structure of the λ/4 microstrip line couplers 12 and 13 formed on a planar substrate. Each of the λ/4 microstrip line couplers 12 and 13 is a coupler made of two parallel strip lines having a pattern length of λ/4 of the RF signal wave length with a pattern width W and a pattern gap G. The pattern length λ/4 of the coupler is roughly determined, for example, based on the wave length λ of center frequency of the anticipated frequency bandwidth of the RF signal. Then, an optimum value of the pattern length λ/4 will be determined by fine tuning the length in view of the desired overall frequency characteristics of the single balanced mixer.

When increasing the pattern gap G, the isolation between the IF signal and the RF signal increases which means that the degree of coupling between the IF signal and the RF signal decreases. Further, when increasing the gap, an insertion loss also increases, which degrades the transmission characteristics of the overall mixer. Therefore, it is necessary to optimize the pattern gap G to fit the design specification. Similarly, the insertion loss decreases when increasing the pattern width W which means that a bandwidth of the coupler is broadened, which degrades the IF signal separation (selectivity) . Therefore, it is necessary to optimize the pattern width W to fit the design specification.

Figure 7:
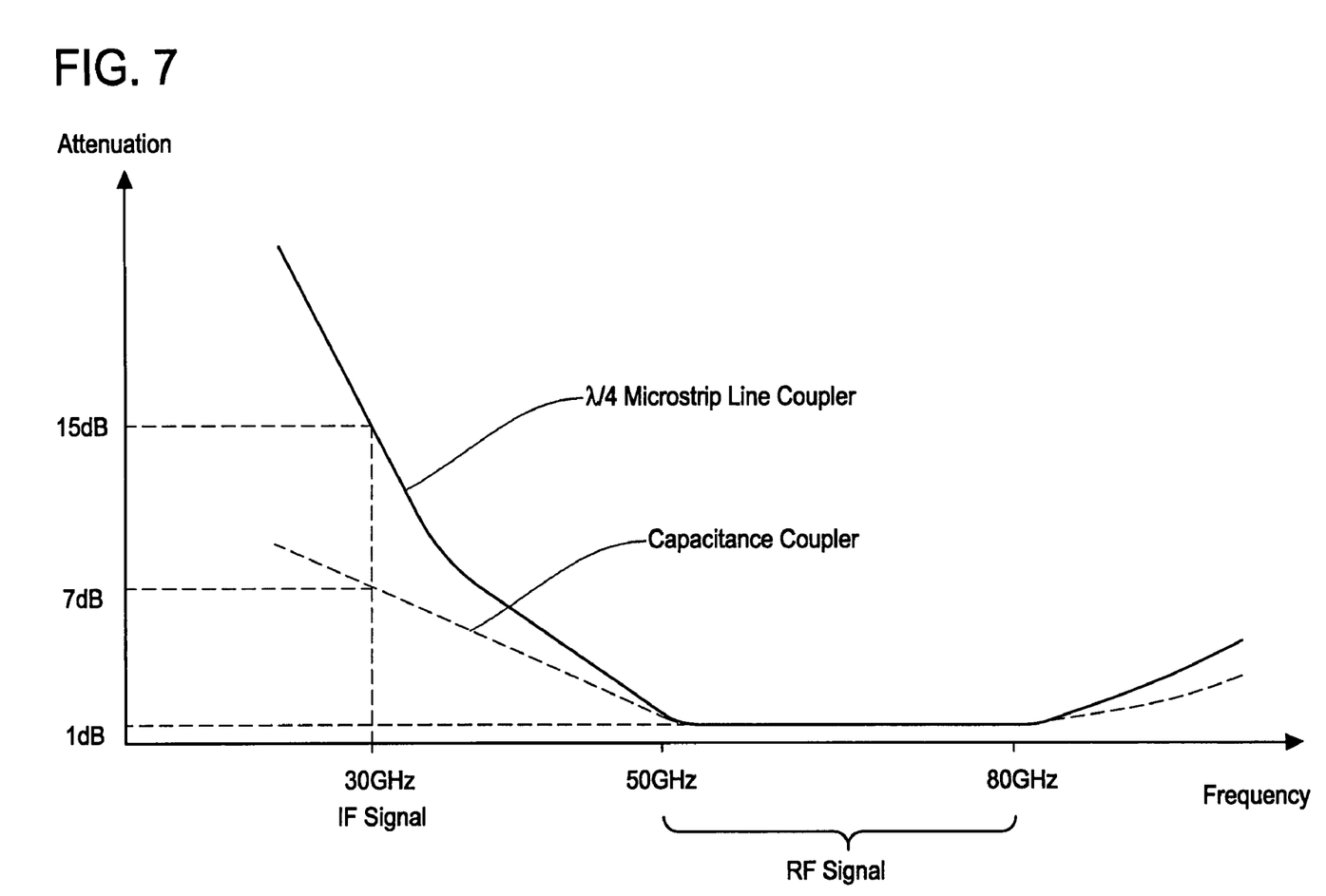
FIG. 7 is a graph showing a frequency characteristic (isolation level) of the λ/4 microstrip line couplers of FIG. 6.

In the single balanced mixer, a degree of isolation between the IF signal and the Rf signal is an important factor in determining the mixer performance. FIG. 7 shows a frequency (isolation) characteristics of the λ/4 microstrip line couplers 12 and 13 of FIG. 6. In this example, when attenuation (insertion loss) for the RF frequency in the range between 50 GHz and 80 GHz is one (1) dB, an attenuation (isolation) level for the IF frequency of 30 GHz is 15 dB. The frequency characteristic of the λ/4 microstrip line couplers 12 and 13 of FIG. 6 shows a better degree of isolation between the IF signal and the RF signal compared to a conventional capacitance coupler which typically has an attenuation (isolation) level of about 7 dB.

However, in an application such as in high precision test instruments, further improvement in the single balanced mixer are desired such as increase in the isolation between the IF signal and the RF signal, decrease in the insertion loss, and increase in the conversion efficiency. As describe in the foregoing, the wide band single balanced mixer of FIGS. 5-7 using the λ/4 microstrip line couplers, is insufficient to meet the requirements in such applications.

SUMMARY OF THE INVENTION

It is, therefore, an object of the present invention to provide a single balanced mixer which has a significantly high degree of isolation between the IF signal and the RF signal even when the frequency difference between the IF signal and the RF signal is small.

It is another object of the present invention to provide a single balanced mixer which has a low insertion loss and a high conversion efficiency throughout a wide frequency range of the input signal.

The single balanced mixer of the present invention has a high degree of isolation between the IF signal and the RF signal and a high conversion efficiency. In the first aspect of the present invention, the single balanced mixer includes means for producing two local signals of same amplitude and opposite phase, a pair of mixing elements each receiving a corresponding one of the two local signals, a pair of strip lines for transmitting the input RF signal to the mixing elements. One end of each of the strip lines is connected to one another at a point where the RF signal is supplied and other end of each of the strip lines is connected to the corresponding mixing element. A length of each of the strip lines is one fourth of a wave length of the IF signal.

The single balanced mixer is formed on a planar surface of a substrate, and the local signals of same amplitude and opposite phase are transmitted to the mixing elements through strip lines. The mixing elements produce the IF signals of same amplitude and opposite phase. In the present invention, the mixing elements are either transistors or diodes.

In the second aspect of the present invention, the single balanced mixer includes a first hybrid coupler for producing two local signals of same amplitude and opposite phase upon receiving the local signal, a pair of mixing elements each receiving a corresponding one of the two local signals from the first hybrid coupler, a pair of λ/4 strip lines for transmitting the input RF signal to the mixing elements wherein one end of each of the λ/4 strip lines is connected to one another at a point where the input RF signal is supplied and other end of each of the λ/4 strip lines is connected to the corresponding mixing element, a pair of IF filters for filtering the IF signals of opposite phase produced at the mixing elements; and a second hybrid coupler for combining the IF signals from the IF filters to produce the IF signal of same phase. The length of each of the λ/4 strip lines is one fourth of a wave length λ of the IF signal.

DETAILED DESCRIPTION OF THE PREFERRED EMBODIMENTS

The single balanced, wide band frequency mixer (hereafter "single balanced mixer") in the first embodiment of the present invention is described with reference to the drawings. In the first embodiment, the single balanced mixer includes field effect transistors (FET) as mixing elements.

Figure 1:
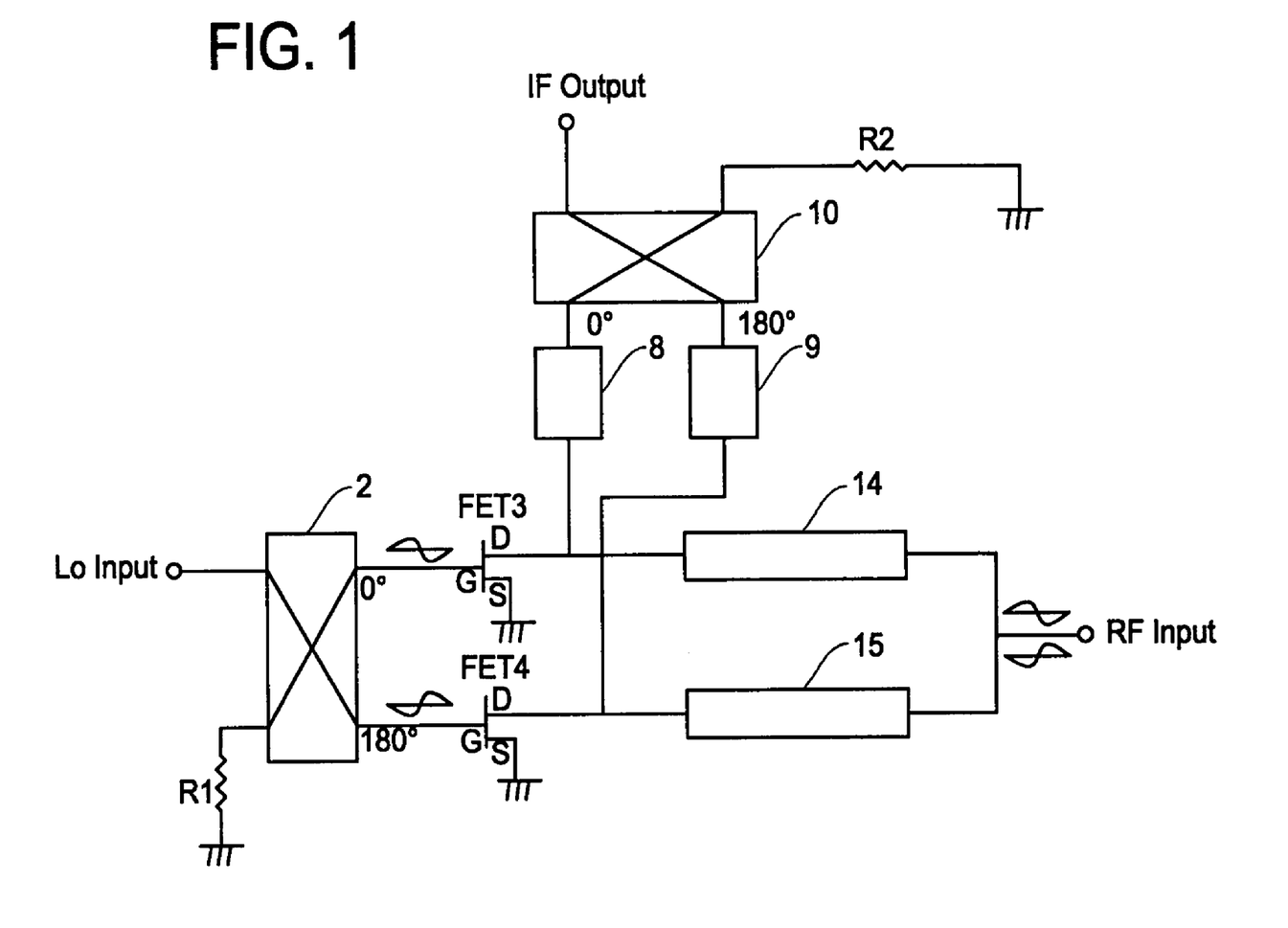
FIG. 1 is a block diagram showing an example of structure of a single balanced mixer in the first embodiment of the present invention.

As shown in FIG. 1, the single balanced mixer is structured with a 180° hybrid coupler 2, terminal resistors R1 and R2, field effect transistors FET3 and FET4, IF frequency λ/4 microstrip lines 14 and 15, IF filters 8 and 9, and a 180° hybrid coupler 10. Namely, the configuration of the single balanced mixer in the first embodiment of FIG. 1 has the same configuration as that of the single balanced mixer shown in FIG. 5, except that the λ/4 microstrip line couplers 12 and 13 are replaced with the IF frequency λ/4 microstrip lines 14 and 15. It should be noted that the single balanced mixer of FIG. 5 is the invention made by the same inventor of the present invention and assigned to the same assignee of the present invention and is not in the public domain, thus, it is not the prior art against the present invention.

In operation, the local signal Lo is supplied to an input terminal of the 180° hybrid coupler 2 whose other input terminal is connected to the terminal resistor R1. The 180° hybrid coupler 2 produces two local signals with the same amplitude and opposite phase (0° and 180°) to one another at its output terminals. The two local signals with opposite phase (0° and 180°) are respectively applied to the gates D of the transistors FET3 and FET4, thereby turning on or off the transistors FET3 and FET4.

The input RF signal is separated into two signals of the same amplitude and same phase at a T-junction near the RF input terminal of FIG. 1. One RF signal is applied to the drain D of the transistor FET3 through the IF frequency λ/4 microstrip line 14, and the other RF signal is applied to the drain D of the transistor FET4 through the IF frequency λ/4 microstrip line 15.

Then, the local signals Lo of the opposite phase and same amplitude and the input RF signals of the same phase and same amplitude are mixed with one another by the frequency mixer formed of the field effect transistors FET3 and FET4. Thus, the frequency conversion is taken place which produces IF (intermediate frequency) signals of opposite phase (0° and 180°) and same amplitude which are produced at the drains D of the transistors FET3 and FET 4.

The IF signals of the opposite phase (0° and 180°) and same amplitude are respectively filtered to a desired IF frequency by the IF filters 8 and 9. The IF filters 8 and 9 are band-pass filters for allowing signals of selected frequency to pass therethrough. Moreover, the two IF signals filtered by the IF filters 8 and 9 are combined in the same phase by the 180° hybrid coupler 10, thereby producing one IF signal. As shown in FIG. 1, the 180° hybrid coupler 10 produces the resultant IF signal at one output terminal while its other terminal is terminated by the resistor R2.

Figure 2:
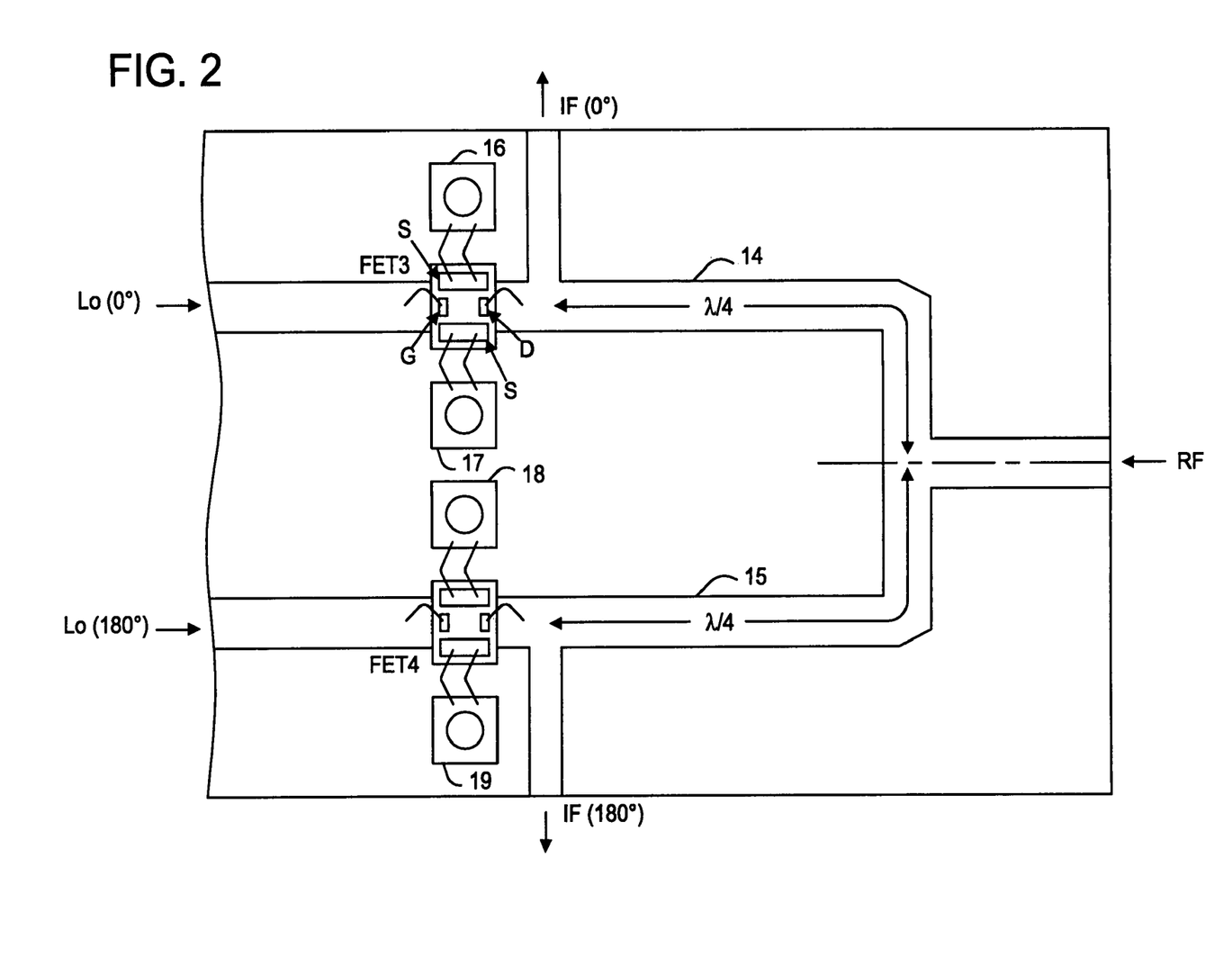
FIG. 2 is a top view showing an example of structure of an IF frequency λ/4 microstrip line incorporated in the single balanced mixer of the present invention.

The top view of the IF frequency λ/4 microstrip lines 14 and 15 is shown in FIG. 2. The pattern length of the IF frequency λ/4 microstrip lines 14 and 15 is designed to be one fourth of the wave length of the intermediate frequency (IF). The IF frequency λ/4 microstrip lines 14 and 15 are connected to an RF signal pattern (strip line).

The gates G of the transistors FET3 and FET4 are respectively connected to local signal patterns (strip lines) to receive the local signals of opposite phase (0° and 180°). The sources S of the transistors FET3 and FET4 are connected to the ground GND via through holes 16-19, and the drains D of the transistors FET3 and FET4 are respectively connected to the IF frequency λ/4 microstrip lines 14 and 15. The IF signals of the same amplitude and opposite phase (0°, 180°) are taken out from the corresponding drains D of FET3 and FET4 through patterns (strip lines) shown in upward and downward directions of FIG. 2.

In the example of FIG. 2, the field effect transistor FET3 and FET4 as mixing elements are in the form of semiconductor chips which are wire bonded to the corresponding patterns (strip lines). Other forms of the transistors FET are also possible such as in a flip chip or MMIC (Monolithic Microwave Integrated Circuit) form.

The operation concerning the IF frequency λ/4 microstrip lines 14 and 15 will be explained here. The input RF signal is separated by the T-junction of the IF frequency λ/4 microstrip lines 14 and 15, and the RF signals of the same amplitude and same phase are fed to the corresponding drains D of the transistors FET3 and FET4. Since each drain D of the transistors FET3 and FET4 are connected at the RF input terminal at the electrical length of λ/4 of the IF signal wave length, and the IF signals from the transistors FET3 and FET4 are in the opposite phase (0°, 180°), the IF signals are canceled out at the RF input terminal.

This means that, with respect to the IF signals, the RF input terminal is equivalent to have a short stub, i.e., connected to the ground. Thus, the impedance seen from the transistors FET3 and FET4 at the IF frequency is infinite. Therefore, the IF signals at the drains D of the transistors FET3 and FET4 will not come out from the RF terminal but will be output solely at the IF signal patterns (upward and downward patters of FIG. 2). Thus, the isolation between the IF signal and RF signal is significantly improved in the single balanced mixer of the present invention.

Figure 3:
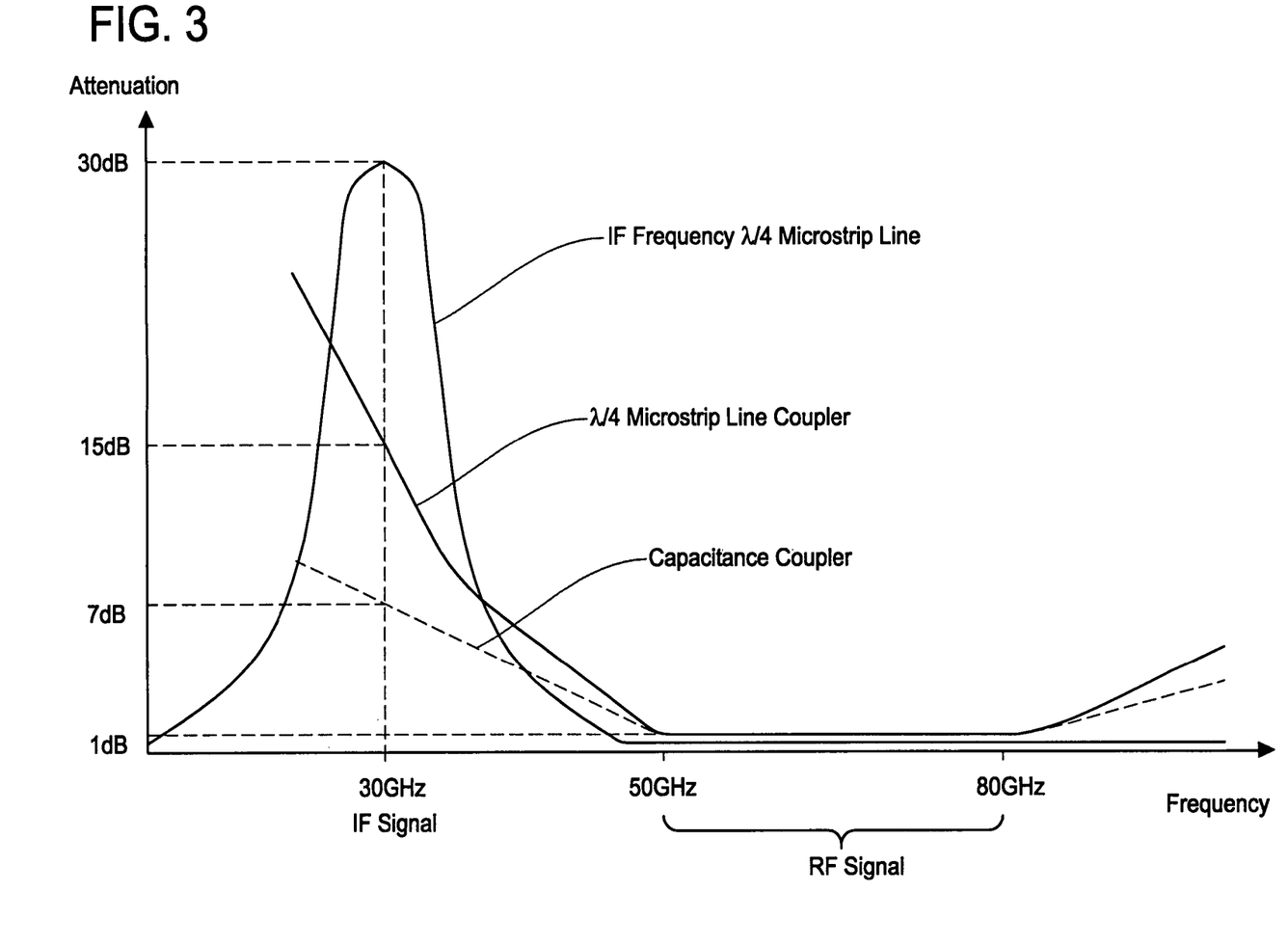
FIG. 3 is a graph showing a frequency characteristic (isolation level) of the IF frequency λ/4 microstrip line of FIG. 2.

FIG. 3 shows the effects of the single balanced mixer of the present invention, such as the improvement in the isolation between the IF signal and the RF signal compared to the single balanced mixer in the prior invention. As shown in FIG. 3, the frequency characteristic of the IF frequency λ/4 microstrip line has an insertion loss of 1 dB at the RF signal frequency range of 50 GHz-80 GHz, and the isolation (attenuation) level of 30 dB is achieved at the IF frequency 30 GHz. Therefore, at the IF frequency 30 GHz, by the IF frequency λ/4 microstrip lines 14 and 15, the degree of isolation between the IF signal and RF signal dramatically increases by 15 dB, i.e from 15 dB (FIG. 7) to 30 dB (FIG. 3). Furthermore, because leakage or loss of the IF signal to the RF signal terminal is dramatically reduced, the frequency conversion efficiency of the mixer of the present invention is also significantly improved.

In the foregoing example, the wide band single balanced mixer of the present invention includes two 180° hybrid couplers 2 and 10 to produce signals of the same amplitude and opposite phase. Such 180° hybrid couplers can be replaced with other components with the same function such as transformers or baluns. Further, transistors other than the field effect transistors FET can be used as the mixing elements such as BJT (Bipolar Junction Transistor) or HBT (Heterojunction Bipolar Transistor).

Figure 4:
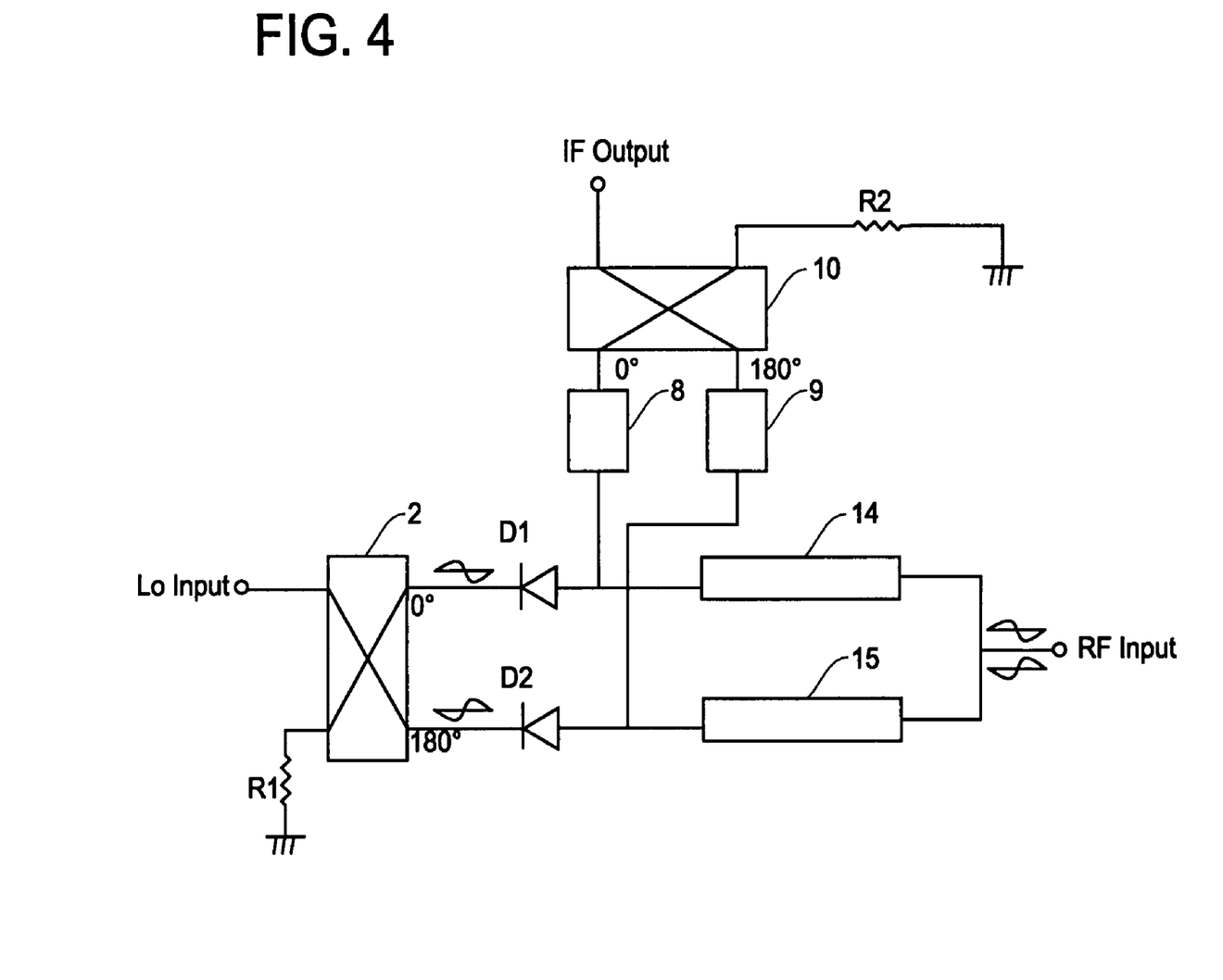
FIG. 4 is a block diagram showing an example of structure of a single balanced mixer in the second embodiment of the present invention.

FIG. 4 shows the single balanced mixer in the second embodiment of the present invention. The single balanced mixer of FIG. 4 includes 180° hybrid couplers 2 and 10, terminal resistors R1 and R2, diodes D1 and D2, IF frequency λ/4 microstrip lines 14 and 15, and IF filters 8 and 9. Thus, only the difference from the first embodiment is the mixing elements which are diodes D1 and D2 in FIG. 4 rather than the transistors FET3 and FET4 in FIG. 1.

In the configuration of FIG. 4, since each of the diodes D1 and D2 is connected to one another at the RF input at the electrical length of λ/4 of the IF frequency, and the IF signals from the diodes D1 and D2 are in the opposite phase (0°, 180°), the IF signals are canceled out at the RF input. This means that, with respect to the IF signals, the RF input terminal is equivalent to have a short stub, i.e., connected to the ground. Thus, the impedance seen from the mixer diodes D1 and D2 at the IF frequency becomes infinite. Therefore, the IF signals at the diodes D1 and D2 will not come out from the RF terminal but will be output at the IF signal patterns. Thus, the isolation between the IF signal and RF signal is significantly improved in the single balanced mixer of the present invention. Further, the conversion efficiency of the mixer is significantly improved because the IF signal will not leak to the RF terminal.

As explained above, the wide band single balanced mixer of the present invention is capable of achieving a high degree of isolation between the IF signal and the RF signal by incorporating the IF frequency λ/4 microstrip lines even when the frequency difference between the IF signal and RF signal is small. Since the leakage of the IF signal to the RF terminal is significantly reduced, the single balanced mixer of the present invention also significantly improves the conversion efficiency. Moreover, because of the reduction in the IF signal leakage, the single balanced mixer of the present invention reduces the insertion loss.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A single balanced mixer for converting an input RF signal to an IF (intermediate frequency) signal by mixing the input RF signal with a local signal, comprising:
    a first hybrid coupler for, upon receiving the local signal, producing two local signals of same amplitude and opposite phase;
    a pair of mixing elements each receiving a corresponding one of the two local signals from the first hybrid coupler;
    a pair of λ/4 strip lines for transmitting the input RF signal to the mixing elements, one end of each of the λ/4 strip lines being connected to one another at a point where the input RF signal is supplied and other end of each of the λ/4 strip lines being connected to the corresponding mixing element;
    a pair of IF filters for filtering the IF signals of opposite phase produced at the mixing elements; and
    a second hybrid coupler for combining the IF signals from the IF filters to produce the IF signal of same phase;
    wherein a length of each of the λ/4 strip lines is one fourth of a wave length λ of the IF signal.

2. A single balanced mixer as defined in claim 1, wherein the single balanced mixer is formed on a planar surface of a substrate, and the two local signals of same amplitude and opposite phase are transmitted to the mixing elements through strip lines.

3. A single balanced mixer as defined in claim 1, wherein the single balanced mixer is formed on a planar surface of a substrate, and the two local signals of same amplitude and opposite phase are transmitted from the first hybrid coupler to the mixing elements through strip lines, and the IF signals of opposite phase are transmitted from the mixing elements to the IF filters through strip lines.

4. A single balanced mixer as defined in claim 1, wherein each of the mixing elements is a transistor.

5. A single balanced mixer as defined in claim 1, wherein each of the mixing elements is a diode.

\* \* \* \* \*